United States Patent
Sasaki et al.

(10) Patent No.: US 10,825,709 B2
(45) Date of Patent: *Nov. 3, 2020

(54) ELECTROSTATIC CHUCKING METHOD AND SUBSTRATE PROCESSING APPARATUS

(71) Applicant: TOKYO ELECTRON LIMITED, Tokyo (JP)

(72) Inventors: Yasuharu Sasaki, Miyagi (JP); Taketoshi Tomioka, Miyagi (JP); Hiroki Kishi, Miyagi (JP); Jisoo Suh, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 39 days.

This patent is subject to a terminal disclaimer.

(21) Appl. No.: 16/361,616

(22) Filed: Mar. 22, 2019

(65) Prior Publication Data

US 2019/0221464 A1   Jul. 18, 2019

Related U.S. Application Data

(63) Continuation of application No. 14/975,377, filed on Dec. 18, 2015, now Pat. No. 10,269,607.

(30) Foreign Application Priority Data

Dec. 25, 2014   (JP) ................................ 2014-262170

(51) Int. Cl.
*H01L 21/683* (2006.01)
*H01T 23/00* (2006.01)
(Continued)

(52) U.S. Cl.
CPC .... *H01L 21/6833* (2013.01); *H01L 21/67109* (2013.01); *H02N 13/00* (2013.01)

(58) Field of Classification Search
CPC ............. H01L 21/6831; H01L 21/6833; H01L 21/67109; H02N 13/00
(Continued)

(56) References Cited

U.S. PATENT DOCUMENTS 6,108,189 A   8/2000   Weldon
6,475,336 B1   11/2002   Hubacek
(Continued)

FOREIGN PATENT DOCUMENTS

JP   2000-349141 A   12/2000
JP   2005-064460 A   3/2005
(Continued)

*Primary Examiner* — Jared Fureman
*Assistant Examiner* — Lucy M Thomas
(74) *Attorney, Agent, or Firm* — Rothwell, Figg, Ernst & Manbeck, P.C.

(57) ABSTRACT

An electrostatic chucking method uses a substrate processing apparatus including an electrostatic chuck, a focus ring, a supply unit configured to supply a heat transfer medium to a space formed between the focus ring and the electrostatic chuck, and a plurality of electrodes provided at a region in the electrostatic chuck which corresponds to the focus ring. The electrostatic chucking method includes supplying by the supply unit the heat transfer medium to the space for a plasma processing period for which a plasma for processing the substrate is generated, and applying different voltages to the plurality of electrodes to attract and hold the focus ring on the electrostatic chuck for a period other than the plasma processing period.

18 Claims, 9 Drawing Sheets

(51) Int. Cl.
*H02N 13/00* (2006.01)
*H01L 21/67* (2006.01)

(58) Field of Classification Search
USPC .......................................................... 361/234
See application file for complete search history.

(56) References Cited

U.S. PATENT DOCUMENTS

| | | | |
|---|---|---|---|
| 7,799,238 B2 * | 9/2010 | Shindo | H01J 37/32082 |
| | | | 156/345.43 |
| 2005/0272227 A1 | 12/2005 | Moriya et al. | |
| 2009/0325387 A1 | 12/2009 | Chen et al. | |
| 2010/0243606 A1 | 9/2010 | Koshimizu et al. | |
| 2010/0326957 A1 * | 12/2010 | Maeda | H01J 7/32642 |
| | | | 216/67 |
| 2012/0175063 A1 | 7/2012 | Yamawaku et al. | |

FOREIGN PATENT DOCUMENTS

| | | |
|---|---|---|
| JP | 2011-034994 A | 2/2011 |
| JP | 4913313 B2 | 4/2012 |

* cited by examiner

FIG. 5

| STATE | SUBSTRATE LOADING/ UNLOADING | PROCESSING RECIPE | LOADING | PLASMA PROCESSING PERIOD | UN-LOADING | WLDC |
|---|---|---|---|---|---|---|
| WAF-HV (V) | | + | | +2500 | | |
| | | 0 | 0 | | 0 | |
| | | − | | | | |
| FR-A-HV (V) | | + | +2500 | +2500 | +2500 | |
| | | 0 | | | | |
| | | − | | | | |
| FR-B-HV (V) | | + | | | | |
| | | 0 | | | | |
| | | − | −2500 | +2500 | −2500 | |
| He SUPPLY | | ON | | | | |
| | | OFF | | | | |

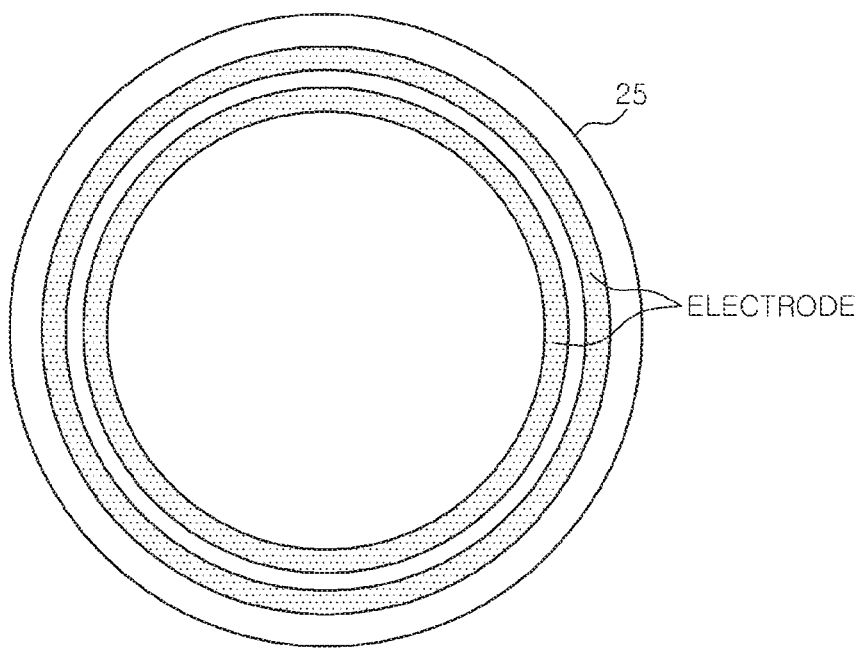

US 10,825,709 B2

ELECTROSTATIC CHUCKING METHOD AND SUBSTRATE PROCESSING APPARATUS

CROSS-REFERENCE TO RELATED APPLICATIONS

This application is a continuation of U.S. application Ser. No. 14/975,377, filed Dec. 18, 2015 which claims priority to Japanese Patent Application No. 2014-262170 filed on Dec. 25, 2014, the disclosures of which are incorporated herein in their entirety by reference, and priority is claimed to each of the foregoing.

FIELD OF THE INVENTION

The disclosure relates to an electrostatic chucking method and a substrate processing apparatus.

BACKGROUND OF THE INVENTION

In a conventional substrate processing apparatus, when a substrate is subjected to a plasma processing, the substrate is attracted and held on an electrostatic chuck by an electrostatic force. A focus ring is provided on the electrostatic chuck to surround a region where the substrate is mounted.

In the above substrate processing apparatus, when a plasma used for the plasma processing for the substrate is generated, a temperature of the focus ring is increased by the plasma. To that end, a heat transfer medium is supplied to a space formed between the focus ring and the electrostatic chuck to suppress the temperature increase. By supplying the heat transfer medium to the space formed between the focus ring and the electrostatic chuck, heat of the focus ring is transferred to the electrostatic chuck via the heat transfer medium.

If airtightness of the space formed between the focus ring and the electrostatic chuck is not ensured, the heat transfer medium supplied to the space leaks to the outside, which results in deterioration of the heat transfer between the focus ring and the electrostatic chuck. Therefore, it is preferable to ensure the airtightness between the focus ring and the electrostatic chuck.

Therefore, there is suggested a technique of attracting and holding a focus ring on an electrostatic chuck by applying a voltage to an electrode provided at a region in the electrostatic chuck which corresponds to the focus ring, see, e.g. Japanese Patent No. 4913313.

However, such a conventional technique has a problem that the amount of leakage of the heat transfer medium supplied to the space formed between the focus ring and the electrostatic chuck may increase.

In other words, in the above conventional technique, misalignment between the focus ring and the electrostatic chuck may occur because the focus ring is not attracted and held on the electrostatic chuck in a period other than a plasma processing period in which a plasma for processing the substrate is generated. If misalignment between the focus ring and the electrostatic chuck occurs, the airtightness of the space formed between the focus ring and the electrostatic chuck deteriorates, and thus, the heat transfer medium supplied to the space leaks to the outside. As a result, in the above conventional technique, the amount of leakage of the heat transfer medium supplied to the space formed between the focus ring and the electrostatic chuck may increase.

SUMMARY OF THE INVENTION

In accordance with an aspect, there is provided an electrostatic chucking method using a substrate processing apparatus including an electrostatic chuck, a focus ring, a supply unit configured to supply a heat transfer medium to a space formed between the focus ring and the electrostatic chuck, and a plurality of electrodes provided at a region in the electrostatic chuck which corresponds to the focus ring. The electrostatic chucking method includes supplying by the supply unit the heat transfer medium to the space for a plasma processing period for which a plasma for processing the substrate is generated, and applying different voltages to the plurality of electrodes to attract and hold the focus ring on the electrostatic chuck for a period other than the plasma processing period.

BRIEF DESCRIPTION OF THE DRAWINGS

The objects and features of the disclosure will become apparent from the following description of embodiments, given in conjunction with the accompanying drawings, in which:

FIG. 5 shows an example of a timechart of an electrostatic attraction process of a second embodiment;

FIG. 7 explains a first arrangement example of a plurality of electrodes;

DETAILED DESCRIPTION OF THE EMBODIMENTS

Figure 1:
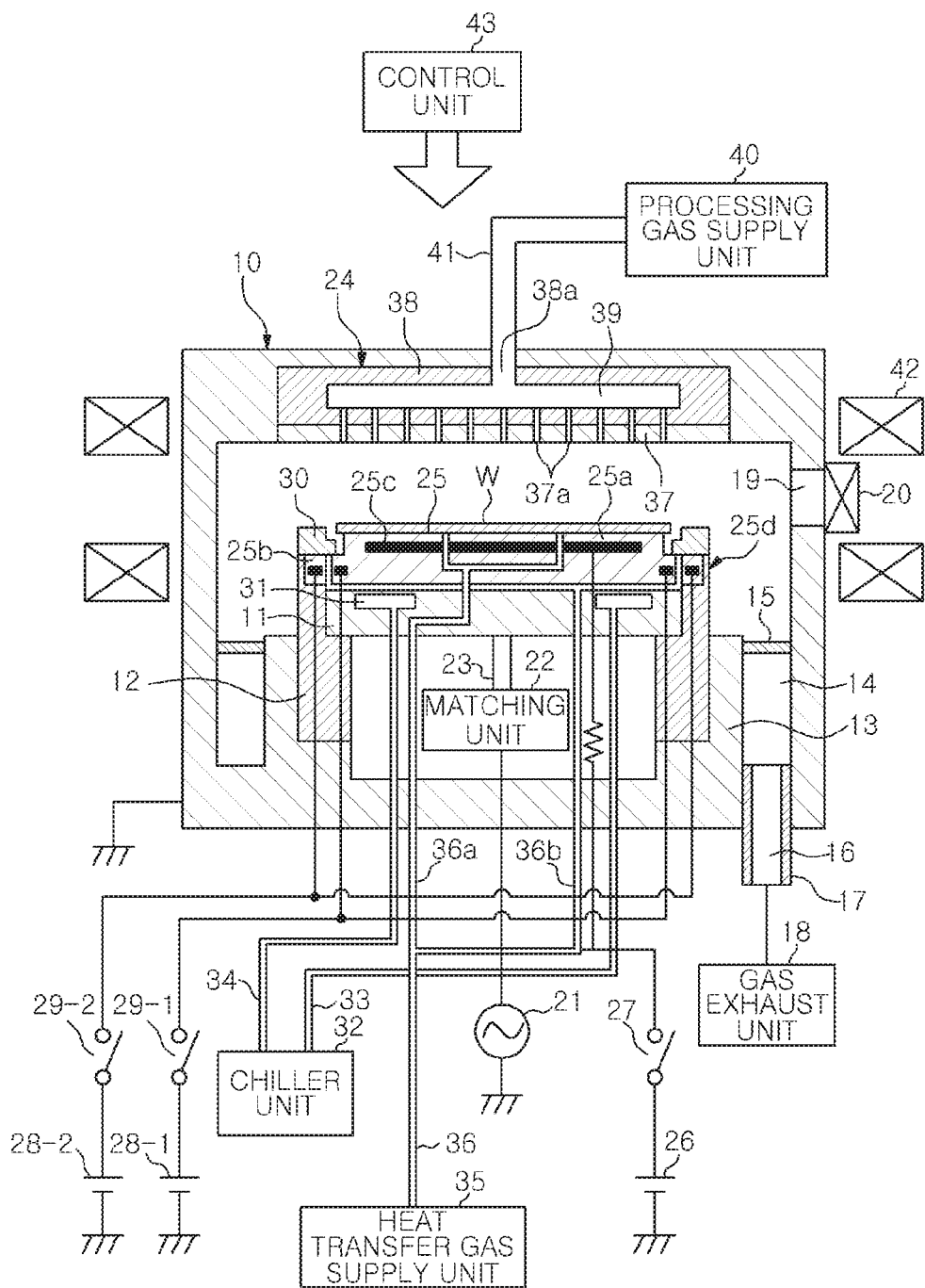
FIG. 1 is a cross sectional view showing a schematic configuration of a plasma processing apparatus according to a first embodiment.

Hereinafter, various embodiments will be described in detail with reference to the accompanying drawings. Like reference numerals refer to like or corresponding parts throughout the drawings.

First Embodiment

FIG. 1 is a cross sectional view showing a schematic configuration of a plasma processing apparatus according to a first embodiment. In the present embodiment, a substrate processing apparatus is configured as an RIE (Reactive Ion Etching) type plasma processing apparatus. However, the substrate processing apparatus may be applied to a plasma etching apparatus or a plasma CVD apparatus which uses a surface wave plasma.

Referring to FIG. 1, the plasma processing apparatus configured as an RIE type plasma processing apparatus includes a cylindrical processing chamber 10 made of a metal, e.g., aluminum or stainless steel, which is frame grounded. Provided in the processing chamber 10 is a circular plate-shaped susceptor (lower electrode) 11 for mounting thereon a wafer W as a processing target (substrate). The susceptor 11 is made of, e.g., aluminum, and supported, through a cylindrical insulating supporting member 12, by a cylindrical supporting part 13 extending vertically upward from a bottom portion of the processing chamber 10.

A gas exhaust path 14 is formed between a sidewall of the processing chamber 10 and the cylindrical supporting part 13. An annular baffle plate 15 is provided at an inlet of the gas exhaust path 14 or in the gas exhaust path 14. A gas exhaust port 16 is provided at a bottom portion of the processing chamber 10. A gas exhaust unit 18 is connected to the gas exhaust port 16 through a gas exhaust line 17. The gas exhaust unit 18 has a vacuum pump and decreases a pressure in a processing space in the processing chamber 10 to a predetermined vacuum level. The gas exhaust line 17 has an automatic pressure control valve (hereinafter, referred to as "APC valve") (not shown) that is an adjustable butterfly valve. The APC valve automatically controls the pressure in the processing chamber 10. A gate valve 20 for opening/closing a loading/unloading port 19 for a wafer W is installed on the sidewall of the processing chamber 10.

A high frequency power supply 21 for plasma generation and RIE is electrically connected to the susceptor 11 via a matching unit 22 and a power feed rod 23. The high frequency power supply 21 applies a high frequency power having a predetermined high frequency, e.g., 60 MHz, to the susceptor 11. A shower head 24 serving as an upper electrode of a ground potential which will be described later is provided at a ceiling portion of the processing chamber 10. Accordingly, a high frequency voltage from the high frequency power supply 21 is applied between the susceptor 11 and the shower head 24.

An electrostatic chuck 25 for attracting and holding the wafer W by an electrostatic attractive force is provided on a top surface of the susceptor 11. The electrostatic chuck 25 includes: a circular plate-shaped central portion 25a on which the wafer W is mounted; and an annular outer peripheral portion 25b. The central portion 25a protrudes upward in the drawing with respect to the outer peripheral portion 25b. A focus ring 30 is provided on a top surface of the outer peripheral portion 25b to surround the central portion 25a. The central portion 25a is formed by sandwiching an electrode plate 25c made of a conductive film between a pair of dielectric films. The outer peripheral portion 25b is formed by sandwiching an electrode plate 25d made of a conductive film between a pair of dielectric films. A DC power source 26 is electrically connected to the electrode plate 25c via a switch 27. DC power supplies 28-1 and 28-2 are electrically connected to the electrode plate 25d via respective switches 29-1 and 29-2. The electrostatic chuck 25 attracts and holds the wafer W on the electrostatic chuck 25 by an electrostatic force such as a Coulomb force or the like which is generated by the DC voltage applied from the DC power supply 26 to the electrode plate 25c. Further, the electrostatic chuck 25 attracts and holds the focus ring 30 on the electrostatic chuck 25 by an electrostatic force such as a Coulomb force, which is generated by the voltage applied from the DC power supplies 28-1 and 28-2 to the electrode plate 25d. The installation of the electrode plate 25d will be described in detail later.

Provided in the susceptor 11 is an annular coolant path 31 extending, e.g., in a circumferential direction. A coolant, e.g., cooling water, of a predetermined temperature is supplied into the coolant path 31 from a chiller unit 32 through lines 33 and 34 to be circulated. A processing temperature of the wafer W on the electrostatic chuck 25 is controlled by the temperature of the coolant.

A heat transfer gas supply unit 35 is connected to the electrostatic chuck 25 through a gas supply line 36. The gas supply line 36 is branched into a wafer side line 36a extending to the central portion 25a of the electrostatic chuck 25 and a focus ring side line 36b extending to the outer peripheral portion 25b of the electrostatic chuck 25. The heat transfer gas supply unit 35 supplies a heat transfer gas to a space formed between the central portion 25a of the electrostatic chuck 25 and the wafer W through the wafer side line 36a. Further, the heat transfer gas supply unit 35 supplies a heat transfer gas to a space formed between the outer peripheral portion 25b of the electrostatic chuck 25 and the focus ring 30 through the focus ring side line 36b. A thermally conductive gas, e.g., He gas, is suitable for the heat transfer gas. The heat transfer gas is an example of the heat transfer medium. The heat transfer gas supply unit 35 is an example of the supply unit for supplying a heat transfer medium.

The shower head 24 provided at the ceiling portion includes: an electrode plate 37 as a bottom surface having a plurality of gas ventholes 37a; and an electrode holder 38 for detachably holding the electrode plate 37. A buffer space 39 is provided inside the electrode holder 38. A gas supply line 41 from a processing gas supply unit 40 is connected to a gas inlet 38a of the buffer space 39. A magnet 42 extending annularly or concentrically is provided around the processing chamber 10.

The components of the plasma processing apparatus, e.g., the gas exhaust unit 18, the high frequency power supply 21, the switches 27, 29-1 and 29-2 for the electrostatic chuck, the DC power supplies 26, 28-1 and 28-2, the chiller unit 32, the heat transfer gas supply unit 35, the processing gas supply unit 40 and the like, are connected to a control unit 43. The control unit 43 controls the respective components of the plasma processing apparatus.

The control unit 43 includes a central processing unit (CPU) (not shown) and a storage unit such as a memory or the like. By reading out and executing a program and a processing recipe stored in the storage unit, a desired process is performed in the plasma processing apparatus. For example, the control unit 43 performs an electrostatic attraction process for electrostatically attracting and holding the focus ring 30. The electrostatic attraction process performed by the control unit 43 will be described later in detail.

In the processing chamber 10 of the plasma processing apparatus, a horizontal magnetic field oriented in one direction is generated by the magnet 42 and, also, a vertical RF electric field is generated by the high frequency voltage applied between the susceptor 11 and the shower head 24. Accordingly, magnetron discharge occurs via the processing gas in the processing chamber 10. As a result, a high-density plasma is generated from the processing gas near the surface of the susceptor 11.

In this plasma processing apparatus, in order to perform a dry etching process, the gate valve 20 is opened, and a wafer W as a processing target is loaded into the processing chamber 10 and mounted on the electrostatic chuck 25. Then, a processing gas (e.g. a gaseous mixture of $C_4F_8$ gas, $O_2$ gas and Ar gas which are mixed at a predetermined flow rate ratio) is introduced at a predetermined flow rate and flow rate ratio from the processing gas supply unit 40 into the processing chamber 10. The pressure in the processing chamber 10 is set to a predetermined value by the gas exhaust unit 18 and the like. A high frequency power is supplied to the susceptor 11 from the high frequency power supply 21. A DC voltage is applied to the electrode plate 25c of the electrostatic chuck 25 from the DC power supply 26. Accordingly, wafer W is attracted and held on the electrostatic chuck 25. The processing gas injected from the shower head 24 is turned into a plasma as described above, and a surface of the wafer W is etched by radicals or ions generated by the plasma.

In this plasma processing apparatus, the processing gas is dissociated into a desirable dissociation state by applying a high frequency power in a frequency range (50 MHz or above) much higher than a conventional frequency level (generally 27 MHz or less) to the susceptor 11. As the dissociated processing gas becomes a plasma, a high-density plasma can be generated even under a low pressure condition. Such high-density plasma enables an oxidation process and a nitriding process to be carried out with a low damage, and greatly contributes to high performance and low power consumption of semiconductor devices. In other words, it is possible to prevent breakage and contamination of the wafer W which would be caused by high-energy particles in the plasma or metal atoms emitted from inner walls of the processing chamber due to a collision of the high-energy particles. Therefore, the plasma can be applied to a gate formation step which requires formation of a high-quality insulation film. Accordingly, the plasma processing apparatus of the present embodiment can deal with technical problems caused by the progress of microprocessing of the wafer W.

Figure 2:
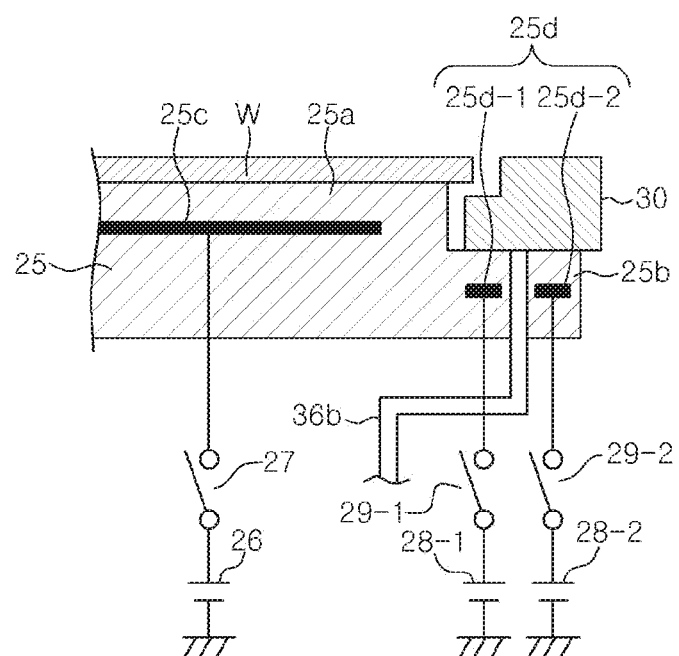
FIG. 2 shows an example of an installation of an electrode plate.

Next, the installation of the electrode plate 25d shown in FIG. 1 will be described. FIG. 2 shows an example of the installation of the electrode plate 25d. As shown in FIG. 2, the electrode plate 25d is provided at a region in the outer peripheral portion 25b of the electrostatic chuck 25 which corresponds to the focus ring 30. The electrode plate 25d includes an inner peripheral electrode plate 25d-1 and an outer peripheral electrode plate 25d-2.

The inner peripheral electrode plate 25d-1 is disposed in an annular shape at the inner peripheral side of the focus ring 30. The inner peripheral electrode plate 25d-1 is electrically connected to the DC power supply 28-1 via the switch 29-1. A positive or a negative voltage for attracting and holding the focus ring 30 on the electrostatic chuck 25 is selectively applied to the inner peripheral electrode plate 25d-1 from the DC power supply 28-1. The polarity of the voltage applied from the DC power supply 28-1 to the inner peripheral electrode plate 25d-1 is switched by the control unit 43.

The outer peripheral electrode plate 25d-2 is disposed in an annular shape at the outer peripheral side of the focus ring 30. The outer peripheral electrode plate 25d-2 is electrically connected to the DC power supply 28-2 via the switch 29-2. A positive or a negative voltage for attracting and holding the focus ring 30 on the electrostatic chuck 25 is selectively applied to the outer peripheral electrode plate 25d-2 from the DC power supply 28-2. The polarity of the voltage applied from the DC power supply 28-2 to the outer peripheral electrode plate 25d-2 is switched by the control unit 43.

Figure 3:
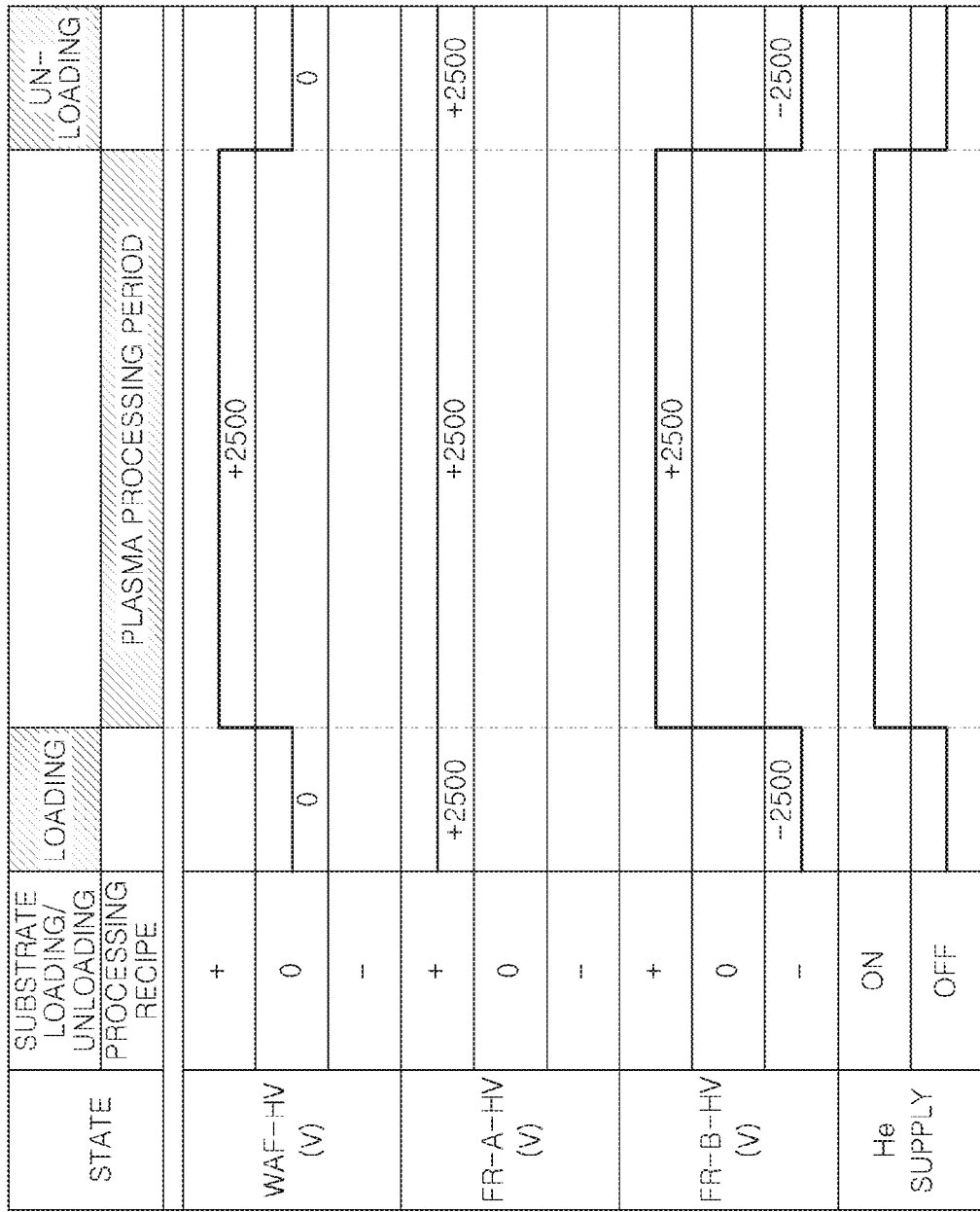
FIG. 3 shows an example of a timechart of an electrostatic attraction process of the first embodiment.

Next, the electrostatic attraction process performed by the control unit 43 of the first embodiment will be described. FIG. 3 shows an example of a timechart of the electrostatic attraction process of the first embodiment.

Referring to FIG. 3, "WAF-HV(V)" represents a timechart showing changes in the voltage for attracting and holding the wafer W on the central portion 25a of the electrostatic chuck 25 which is applied to the electrode plate 25c; "FR-A-HV(V)" represents a timechart showing changes in the voltage for attracting and holding the focus ring 30 on the outer peripheral portion 25b of the electrostatic chuck 25 which is applied to the inner peripheral electrode plate 25d-1; "FR-B-HV(V)" represents a timechart showing changes in the voltage for attracting and holding the focus ring 30 on the outer peripheral portion 25b of the electrostatic chuck 25 which is applied to the outer peripheral electrode plate 25d-2; and "He supply" represents a timechart showing changes of the supply state of He gas supplied as a heat transfer gas from the heat transfer gas supply unit 35 to the space formed between the electrostatic chuck 25 and the focus ring 30.

Referring to FIG. 3, "plasma processing period" represents a period in which a plasma for processing the wafer W is generated. "Loading" represents a period in which the wafer W is loaded into the processing chamber 10. "Unloading" represents a period in which the wafer W is unloaded from the processing chamber 10.

In the electrostatic attraction process of the first embodiment, in the plasma processing period, the control unit 43 controls the heat transfer gas supply unit 35 to supply a heat transfer gas to the space formed between the electrostatic chuck 25 and the focus ring 30. Further, in a period other than the plasma processing period, the control unit 43 controls such that different voltages are applied to the inner peripheral electrode plate 25d-1 and the outer peripheral electrode plate 25d-2 to generate a potential difference between the inner peripheral electrode plate 25d-1 and the outer peripheral electrode plate 25d-2 in a state where the heat transfer gas is not supplied to the space formed between the electrostatic chuck 25 and the focus ring 30.

In other words, in a period other than the plasma processing period, i.e., a period in which the wafer W is loaded into the processing chamber 10, the control unit 43 controls the heat transfer gas supply unit 35 not to supply the heat transfer gas to the space formed between the electrostatic chuck 25 and the focus ring 30, as shown in FIG. 3. Further, in the period in which the wafer W is loaded into the processing chamber 10, the control unit 43 controls such that different voltages are applied to the inner peripheral electrode plate 25d-1 and the outer peripheral electrode plate 25d-2 to generate a potential difference between the inner peripheral electrode plate 25d-1 and the outer peripheral electrode plate 25d-2 in a state where the heat transfer gas is not supplied to the space formed between the electrostatic chuck 25 and the focus ring 30. Specifically, the control unit 43 controls such that a voltage of a predetermined polarity is applied to the inner peripheral electrode plate 25d-1 from the DC power supply 28-1 and a voltage of the opposite polarity is applied to the outer peripheral electrode plate 25d-2 from the DC power supply 28-2. In the example shown in FIG. 3, the control unit 43 controls such that a positive voltage of 2500V is applied to the inner peripheral electrode plate 25d-1 and a negative voltage of −2500V is applied to the outer peripheral electrode plate 25d-2 to generate a potential difference between the inner peripheral electrode plate 25d-1 and the outer peripheral electrode plate 25d-2. Accordingly, an electrostatic force is generated by the potential difference between the inner peripheral electrode plate 25d-1 and the outer peripheral electrode plate 25d-2 and the focus ring 30 is attracted and held on the electrostatic chuck 25 by the electrostatic force thus generated. As a result, in the period in which the wafer W is loaded into the processing chamber 10, a misalignment between the electrostatic chuck 25 and the focus ring 30 is avoided and an airtightness of the space formed between the electrostatic chuck 25 and the focus ring 30 is ensured.

The control unit 43 stops the application of the voltage to the electrode plate 25c in the period in which the wafer W is loaded into the processing chamber 10.

Next, in the plasma processing period, the control unit 43 controls such that a positive voltage is applied to the inner peripheral electrode plate 25d-1 from the DC power supply 28-1 and a positive voltage is applied to the outer peripheral electrode plate 25d-2 from the DC power supply 28-2. In the example shown in FIG. 3, the control unit 43 controls such that a positive voltage of 2500V is applied to the inner peripheral electrode plate 25d-1 and the outer peripheral electrode plate 25d-2 to generate a potential difference between the focus ring 30 which is set to a ground potential through the plasma and the inner and the outer peripheral electrode plate 25d-1 and 25d-2. Accordingly, an electrostatic force is generated by the potential difference between the inner and the outer peripheral electrode plate 25d-1 and 25d-2 and the focus ring 30 which is set to the ground potential through the plasma, and the focus ring 30 is attracted and held on the electrostatic chuck 25 by the electrostatic force thus generated. Then, in the plasma processing period, the heat transfer gas is supplied from the heat transfer gas supply unit 35 to the space formed between the electrostatic chuck 25 and the focus ring 30. Since the airtightness of the space formed between the electrostatic chuck 25 and the focus ring 30 is ensured in the period in which the wafer W is loaded into the processing chamber 10, the leakage of the heat transfer gas supplied from the heat transfer gas supply unit 35 is suppressed in the plasma processing period.

In the plasma processing period, the control unit 43 controls such that a voltage is applied to the electrode plate 25c to generate an electrostatic force on the electrostatic chuck 25 and allow the wafer W loaded into the processing chamber 10 to be attracted and held on the electrostatic chuck 25.

Next, in a period other than the plasma processing period, i.e., a period in which the wafer W is unloaded from the processing chamber 10, the control unit 43 controls the heat transfer gas supply unit 35 not to supply the heat transfer gas to the space formed between the electrostatic chuck 25 and the focus ring 30. In the period in which the wafer W is unloaded from the processing chamber 10, the control unit 43 controls such that different voltages are applied to the inner peripheral electrode plate 25d-1 and the outer peripheral electrode plate 25d-2 to generate a potential difference between the inner peripheral electrode plate 25d-1 and the outer peripheral electrode plate 25d-2 in a state where the heat transfer gas is not supplied to the space formed between the electrostatic chuck 25 and the focus ring 30. Specifically, the control unit 43 controls such that a voltage of a predetermined polarity is applied to the inner peripheral electrode plate 25d-1 from the DC power supply 28-1 and a voltage of the opposite polarity is applied to the outer peripheral electrode plate 25d-2 from the DC power supply 28-2. In the example shown in FIG. 3, the control unit 43 controls such that a positive voltage of 2500V is applied to the inner peripheral electrode plate 25d-1 and a negative voltage of −2500V is applied to the outer peripheral electrode plate 25d-2 to generate a potential difference between the inner peripheral electrode plate 25d-1 and the outer peripheral electrode plate 25d-2. Accordingly, an electrostatic force is generated by the potential difference between the inner peripheral electrode plate 25d-1 and the outer peripheral electrode plate 25d-2 and the focus ring 30 is attracted and held on the electrostatic chuck 25 by the electrostatic force thus generated. As a result, in the period in which the wafer W is unloaded from the processing chamber 10, the misalignment between the electrostatic chuck 25 and the focus ring 30 is avoided and the airtightness of the space formed between the electrostatic chuck 25 and the focus ring 30 is ensured.

The control unit 43 controls stops the application of the voltage to the electrode plate 25c in the period in which the wafer W is unloaded from the processing chamber 10.

In the substrate processing apparatus of the first embodiment, in the period other than the plasma processing period, different voltages are applied to the inner peripheral electrode plate 25d-1 and the outer peripheral electrode plate 25d-2 such that a potential difference is generated between the inner peripheral electrode plate 25d-1 and the outer peripheral electrode plate 25d-2 in a state where the heat transfer gas is not supplied to the space formed between the electrostatic chuck 25 and the focus ring 30. Accordingly, an electrostatic force is generated by the potential difference between the inner peripheral electrode plate 25d-1 and the outer peripheral electrode plate 25d-2, and the focus ring 30 is attracted and held on the electrostatic chuck 25 by the electrostatic force thus generated. Therefore, in the period other than the plasma processing period, the misalignment between the electrostatic chuck 25 and the focus ring 30 is avoided and the airtightness of the space formed between the electrostatic chuck 25 and the focus ring 30 is ensured. As a result, in the plasma processing period, the increase in the amount of leakage of the heat transfer gas supplied to the space formed between the focus ring 30 and the electrostatic chuck 25 can be suppressed.

Figure 4:
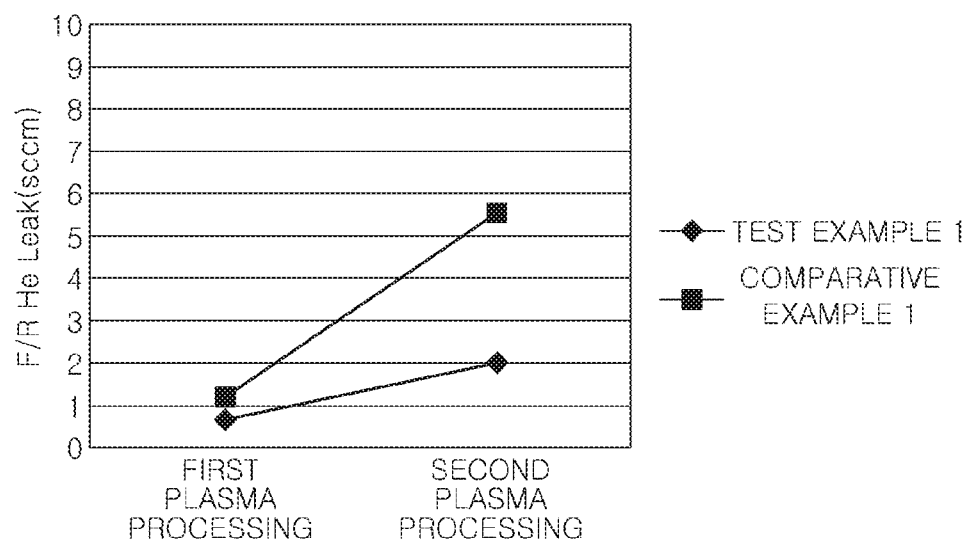
FIG. 4 shows an example of a result of an experiment for comparing the amount of leakage of a heat transfer gas supplied to a space formed between an electrostatic chuck and a focus ring in the first embodiment.

FIG. 4 shows an example of a result of an experiment for comparing the amount of leakage of the heat transfer gas supplied to the space formed between the electrostatic chuck 25 and the focus ring 30 in the first embodiment. In FIG. 4, the vertical axis represents the amount of leakage (sccm) of He gas supplied as the heat transfer gas to the space formed between the electrostatic chuck 25 and the focus ring 30, and the horizontal axis represents the number of execution of the plasma processing. s. In the experiment shown in FIG. 4, upon completion of the first plasma processing in an initial plasma processing period, the loading/unloading of the wafer W is carried out and, then, the second plasma processing is performed in a next plasma processing period. The second plasma processing and the first plasma processing are carried out under the same processing condition.

In a comparative example 1 of the experiment shown in FIG. 4, the plasma processing was performed without using the electrostatic attraction process for applying different voltages to the inner peripheral electrode plate 25d-1 and the outer peripheral electrode plate 25d-2 in a period other than the plasma processing period. In a test example 1, the plasma processing was performed by using the electrostatic attraction process for applying different voltages to the inner peripheral electrode plate 25d-1 and the outer peripheral electrode plate 25d-2 in a period other than the plasma processing period.

As shown in FIG. 4, in the comparative example 1, the amount of leakage of He gas in the second plasma processing was increased by about 5 sccm compared to the amount of leakage of He gas in the first plasma processing.

On the other hand, in the test example 1, the amount of leakage of He gas in the second plasma processing was increased by about 1 sccm compared to the amount of leakage of He gas in the first plasma processing. In other words, in the test example 1 using the electrostatic attraction process for applying different voltages to the inner peripheral electrode plate 25d-1 and the outer peripheral electrode plate 25d-2 in the period other than the plasma processing period, the increase in the amount of leakage of the heat transfer gas supplied to the space formed between the focus ring 30 and the electrostatic chuck 25 was suppressed.

Second Embodiment

In the first embodiment, there has been described the example in which different voltages are applied to a plurality of electrodes in a period other than the plasma processing period and the heat transfer gas is supplied to the space formed between the electrostatic chuck 25 and the focus ring 30 in the plasma processing period. However, the disclosure is not limited thereto. For example, the increase in the amount of leakage of the heat transfer gas can be suppressed by applying different voltages to a plurality of electrodes arranged at predetermined positions in a plasma processing period to attract and hold the focus ring 30 on the electrostatic chuck 25. Specifically, in a cleaning period in which a plasma for cleaning the processing chamber 10 is generated, the heat transfer gas is supplied to the space formed between the electrostatic chuck 25 and the focus ring 30. In that case, different voltages may be applied to a plurality of electrodes. Therefore, in the second embodiment, an example in which different voltages are applied to a plurality of electrodes in the cleaning period will be described. The configuration of the plasma processing apparatus according to the second embodiment is the same as that of the plasma processing apparatus according to the first embodiment. Therefore, the description thereof will be omitted.

FIG. 5 shows an example of a timechart of the electrostatic attraction process of the second embodiment.

Referring to FIG. 5, "WAF-HV(V)" represents a timechart showing changes in the voltage for attracting and holding the wafer W on the central portion 25a of the electrostatic chuck 25 which is applied to the electrode plate 25c; "FR-A-HV(V)" represents a timechart showing changes in the voltage for attracting and holding the focus ring 30 on the outer peripheral portion 25b of the electrostatic chuck 25 which is applied to the inner peripheral electrode plate 25d-1; "FR-B-HV(V)" represents a timechart showing changes in the voltage for attracting and holding the focus ring 30 on the outer peripheral portion 25b of the electrostatic chuck 25 which is applied to the outer peripheral electrode plate 25d-2; and "He supply" represents a timechart showing changes of the supply state of He gas supplied as a heat transfer gas from the heat transfer gas supply unit 35 to the space formed between the electrostatic chuck 25 and the focus ring 30.

Referring to FIG. 5, "plasma processing period" represents a period in which a plasma for processing the wafer W is generated. "Loading" represents a period in which the wafer W is loaded into the processing chamber 10. "Unloading" represents a period in which the wafer W is unloaded from the processing chamber 10. "WLDC" represents a period in which a plasma for cleaning the processing chamber 10 is generated (hereinafter, referred to as "cleaning period") after the wafer W is unloaded from the processing chamber 10 and before a next wafer W is loaded into the processing chamber 10.

The electrostatic attraction process of the second embodiment is basically the same as that of the first embodiment except the following features. Therefore, the description of the same electrostatic attraction process will be omitted in the following description.

In other words, the control unit 43 controls the heat transfer gas supply unit 35 to supply the heat transfer gas to the space formed between the electrostatic chuck 25 and the focus ring 30 in the cleaning period as shown in FIG. 5. Further, in the cleaning period, the control unit 43 controls such that different voltages are applied to the inner peripheral electrode plate 25d-1 and the outer peripheral electrode plate 25d-2 to generate a potential difference between the inner peripheral electrode plate 25d-1 and the outer peripheral electrode plate 25d-2 in a state where the heat transfer gas is supplied to the space formed between the electrostatic chuck 25 and the focus ring 30. Specifically, the control unit 43 controls such that a voltage of a predetermined polarity is applied to the inner peripheral electrode plate 25d-1 from the DC power supply 28-1 and a voltage of the opposite polarity is applied to the outer peripheral electrode plate 25d-2 from the DC power supply 28-2. In the example shown in FIG. 5, the control unit 43 controls such that a positive voltage of 2500V is applied to the inner peripheral electrode plate 25d-1 and a negative voltage of −2500V is applied to the outer peripheral electrode plate 25d-2 to generate a potential difference between the inner peripheral electrode plate 25d-1 and the outer peripheral electrode plate 25d-2. Accordingly, an electrostatic force is generated by the potential difference between the inner peripheral electrode plate 25d-1 and the outer peripheral electrode plate 25d-2, and the focus ring 30 is attracted and held on the electrostatic chuck 25 by the electrostatic force thus generated. As a result, in the cleaning period, the misalignment between the electrostatic chuck 25 and the focus ring 30 is avoided, and the airtightness of the space formed between the electrostatic chuck 25 and the focus ring 30 is ensured.

An electron density of the plasma generated in the cleaning period is lower than that of the plasma generated in the plasma processing period. Thus, in the cleaning period, it is difficult to set the focus ring 30 to have a ground potential through the plasma. Therefore, if the potential difference is not generated between the inner peripheral electrode plate 25d-1 and the outer peripheral electrode plate 25d-2, a potential difference is not generated between the focus ring 30 and the inner and the outer peripheral electrode plate 25d-1 and 25d-2. Accordingly, the focus ring 30 may not be attracted and held on the electrostatic chuck 25.

On the other hand, in the cleaning period the control unit 43 of the present embodiment controls such that different voltages are applied to the inner peripheral electrode plate 25d-1 and the outer peripheral electrode plate 25d-2 to generate a potential difference between the inner peripheral electrode plate 25d-1 and the outer peripheral electrode plate 25d-2. Therefore, even when it is difficult to set the focus ring 30 to have the ground potential through the plasma in the cleaning period, the focus ring 30 is attracted and held on the electrostatic chuck 25 by an electrostatic force generated by the potential difference between the inner peripheral electrode plate 25d-1 and the outer peripheral electrode plate 25d-2. Accordingly, in the cleaning period, the airtightness of the space formed between the electrostatic chuck 25 and the focus ring 30 is ensured.

In the substrate processing apparatus according to the second embodiment, different voltages are applied to the inner peripheral electrode plate 25d-1 and the outer peripheral electrode plate 25d-2 such that a potential difference is generated between the inner peripheral electrode plate 25d-1 and the outer peripheral electrode plate 25d-2 in a state where the heat transfer gas is supplied to the space formed between the electrostatic chuck 25 and the focus ring 30 in a period other than the plasma processing period, i.e., in the cleaning period. Accordingly, an electrostatic force is generated by the potential difference between the inner peripheral electrode plate 25d-1 and the outer peripheral electrode plate 25d-2 and the focus ring 30 is attracted and held on the electrostatic chuck 25 by the electrostatic force thus generated. Therefore, in the cleaning period, the misalignment between the electrostatic chuck 25 and the focus ring 30 is avoided, and the airtightness of the space formed between the electrostatic chuck 25 and the focus ring 30 is ensured. As a result, in the plasma processing period, the increase in the amount of leakage of the heat transfer gas supplied to the space formed between the focus ring 30 and the electrostatic chuck 25 can be suppressed.

Although the effect of suppressing the increase in the amount of leakage of the heat transfer gas in a period other than the plasma processing period has been described, it is not limited to the cleaning period. The increase in the amount of leakage of the heat transfer gas can be suppressed even under a weak plasma processing condition that can be an alternative for the cleaning period. For example, in the cleaning period, a high frequency power of 800 W is used as a high frequency power for plasma generation. Accordingly, under the alternative weak plasma processing condition, a plasma is generated by a high frequency power ranging from 0 W to 2000 W.

Figure 6A:
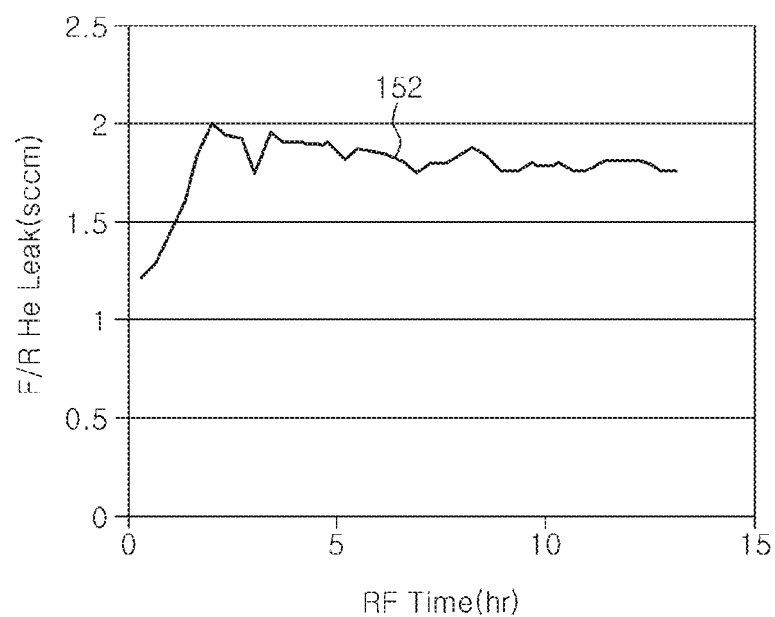
FIGS. 6A and 6B show examples of results of experiments of comparing the amount of leakage of a heat transfer gas supplied to the space formed between the electrostatic chuck and the focus ring in the second embodiment.
Figure 6B:
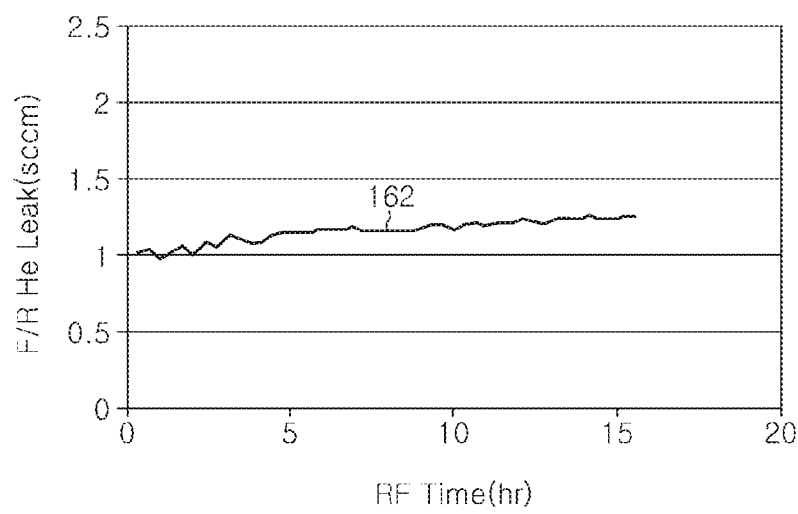

FIGS. 6A and 6B show an example of result of experiments for comparing the amount of leakage of the heat transfer gas supplied to the space formed between the electrostatic chuck 25 and the focus ring 30 in the second embodiment. In FIGS. 6A and 6B, the vertical axis represents the amount of leakage (sccm) of He gas supplied as the heat transfer gas to the space formed between the electrostatic chuck 25 and the focus ring 30, and the horizontal axis represents an accumulated time (hr) of the plasma processing performed in the plasma processing period.

In FIG. 6A, graph 152 shows the amount of leakage of He gas in the case of performing plasma processing without using the electrostatic attraction process for applying different voltages to the inner peripheral electrode plate 25d-1 and the outer peripheral electrode plate 25d-2 in the cleaning period.

In FIG. 6B, graph 162 shows the amount of leakage of He gas in the case of performing plasma processing by using the electrostatic attraction process for applying different voltages to the inner peripheral electrode plate 25d-1 and the outer peripheral electrode plate 25d-2 in the cleaning period.

As shown in FIG. 6A, the amount of leakage of He gas in each plasma processing was increased by about 1 sccm in the case of not using the electrostatic attraction process for applying different voltages to the inner peripheral electrode plate 25d-1 and the outer peripheral electrode plate 25d-2 in the cleaning period.

On the other hand, the amount of leakage of He gas in each plasma processing was increased by less than 1 sccm in the case of using the electrostatic attraction process for applying different voltages to the inner peripheral electrode plate 25d-1 and the outer peripheral electrode plate 25d-2 in the cleaning period. In other words, in the case of using the electrostatic attraction process for applying different voltages to the inner peripheral electrode plate 25d-1 and the outer peripheral electrode plate 25d-2 in the cleaning period, it is possible to suppress the increase in the amount of leakage of the heat transfer gas supplied to the space formed between the focus ring 30 and the electrostatic chuck 25.

In the first and the second embodiment, there has been described a period in which the wafer W is loaded into the processing chamber 10, a period in which the wafer W is unloaded from the processing chamber 10, and a cleaning period as a period other than the plasma processing period. However, such a period is not limited thereto. For example, the control unit 43 may control such that different voltages are applied to the inner peripheral electrode plate 25d-1 and the outer peripheral electrode plate 25d-2 to generate a potential difference between the inner peripheral electrode plate 25d-1 and the outer peripheral electrode plate 25d-2 in a period other than the plasma processing period, i.e., a period in which the operation of the substrate processing apparatus (plasma processing apparatus) is stopped. Accordingly, in the period in which the operation of the substrate processing apparatus is stopped, the misalignment between the electrostatic chuck 25 and the focus ring 30 is avoided and the airtightness of the space formed between the electrostatic chuck 25 and the focus ring 30 is ensured. As a result, in the plasma processing period, it is possible to suppress the increase in the amount of leakage of the heat transfer gas supplied to the space formed between the focus ring 30 and the electrostatic chuck 25.

Further, for the sake of convenience, in the first and the second embodiment, the electrodes are arranged at the inner peripheral side and the outer peripheral side of the focus ring 30. However, the arrangement of a plurality of electrodes is not limited thereto. For example, a plurality of electrodes may be arranged at positions serving as electrostatic chucks. In this case, the control unit 43 may control such that a voltage of a predetermined polarity is applied to some of the plurality of electrodes and a voltage of the opposite polarity is applied to the other electrodes.

Hereinafter, an arrangement example of a plurality of electrodes will be described. FIG. 7 explains a first arrangement example of a plurality of electrodes. As shown in FIG. 7, a plurality of electrodes may be concentrically arranged at a region in the electrostatic chuck 25 which corresponds to the focus ring 30.

Figure 8A:
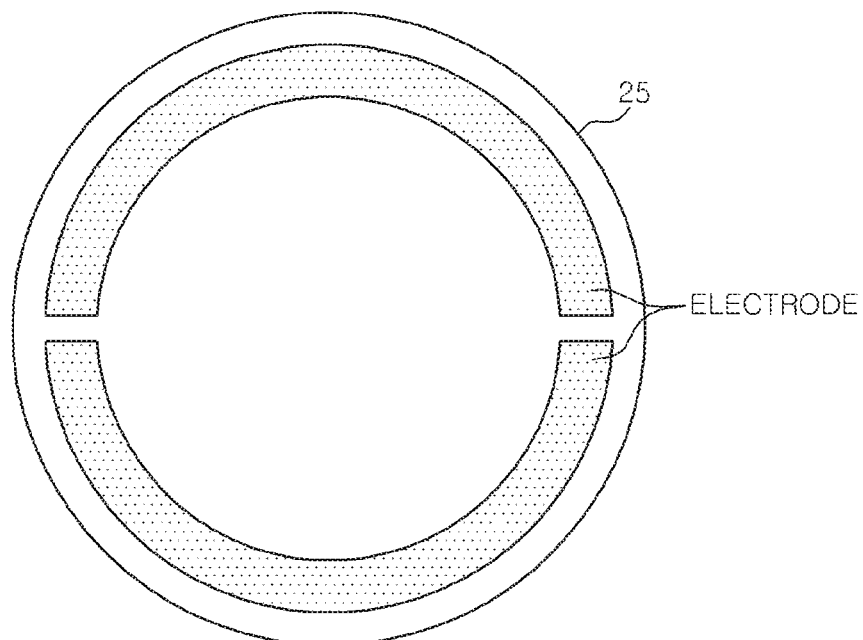
FIGS. 8A and 8B explain a second arrangement example of the plurality of electrodes.
Figure 8B:
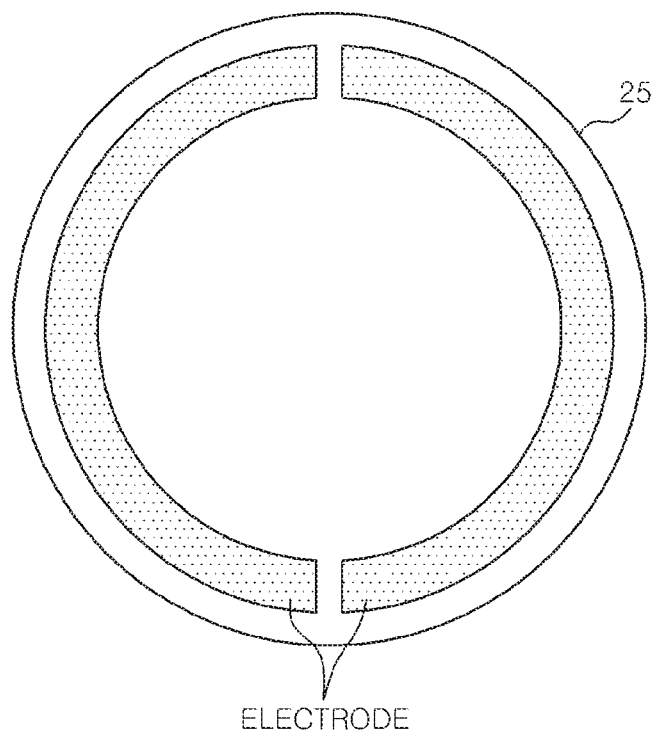

FIGS. 8A and 8B explain a second arrangement example of a plurality of electrodes. As shown in FIGS. 8A and 8B, a plurality of electrodes may be arranged in semi circles at a region in the electrostatic chuck 25 which corresponds to the focus ring 30.

Figure 9:
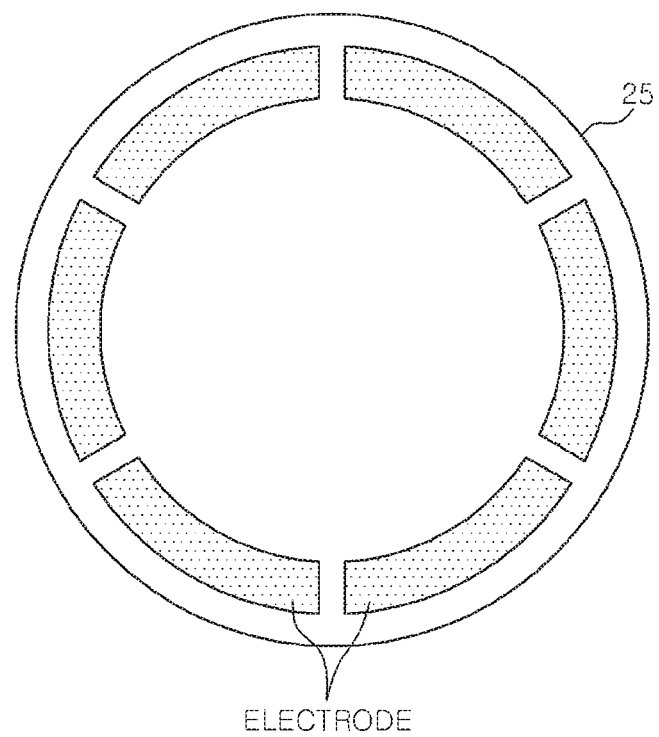
FIG. 9 explains a third arrangement example of the plurality of electrodes.

FIG. 9 explains a third arrangement example of a plurality of electrodes. As shown in FIG. 9, a plurality of electrodes may be alternately arranged at a region in the electrostatic chuck 25 which corresponds to the focus ring 30.

While the disclosure has been shown and described with respect to the embodiments, it will be understood by those skilled in the art that various changes and modifications may be made without departing from the scope of the disclosure as defined in the following claims.

What is claimed is:

1. A substrate processing apparatus comprising:
    a processing chamber configured to provide a processing space;
    a substrate mounting part configured to electrostatically attract a substrate;
    a focus ring;
    a focus ring mounting part configured to electrostatically attract the focus ring, the focus ring mounting part surrounding the substrate mounting part and including a plurality of electrodes; and
    a control unit configured to generate a potential difference among the plurality of electrodes to attract the focus ring for a period other than a plasma processing period,
    wherein the focus ring includes a one-piece focus ring part extending continuously from an outer periphery to an inner periphery of the one-piece focus ring part, and
    wherein the plurality of electrodes are disposed below a bottom surface of the one-piece focus ring part such that each electrode from the plurality of electrodes is partially overlapped or entirely overlapped by the bottom surface of the one-piece focus ring part from a top view perspective of the focus ring.

2. The substrate processing apparatus of claim 1, further comprising a supply unit configured to supply a heat transfer medium to a space between the focus ring mounting part and the focus ring for the plasma processing period for which a plasma is generated in the processing chamber.

3. The substrate processing apparatus of claim 2, wherein, during the period other than the plasma processing period, the control unit is configured to attract the one-piece focus ring part in a state where the heat transfer medium is not supplied to the space.

4. The substrate processing apparatus of claim 1, wherein the control unit is configured to generate the potential difference among the plurality of electrodes by applying voltages having different polarities to the plurality of electrodes.

5. The substrate processing apparatus of claim 1, wherein the plasma processing period includes a period for plasma processing the substrate.

6. The substrate processing apparatus of claim 1, wherein the substrate processing apparatus further includes a center electrode positioned radially inside of the plurality of electrodes, and wherein the control unit is configured to control application of voltages to the center electrode and the plurality of electrodes such that:
a voltage is applied to the center electrode during the plasma processing period;
a voltage is applied to at least one of the plurality of electrodes during the plasma processing period; and
no voltage is applied to the center electrode during the period other than the plasma processing period, and at least two different non-zero voltages are applied to the plurality of electrodes during the period other than the plasma processing period.

7. The substrate processing apparatus of claim 1, wherein the control unit is configured to control application of voltages of different polarities to the plurality of electrodes during the period other than the plasma processing period.

8. The substrate processing apparatus of claim 1, wherein the control unit is configured to control application of a same voltage to each of the plurality of electrodes during the plasma processing period.

9. The substrate processing apparatus of claim 1, wherein the period other than the plasma processing period during which the potential difference among the plurality of electrodes is generated to attract the one-piece focus ring part includes at least one of a substrate loading period during which a substrate is loaded into the processing chamber or a substrate unloading period during which a substrate is unloaded from the processing chamber.

10. The substrate processing apparatus of claim 1, wherein the plasma processing period includes a period for plasma processing the substrate, and
wherein positive voltages are applied to the plurality of electrodes for the period for plasma processing the substrate.

11. The substrate processing apparatus of claim 10, wherein a same voltage is applied to each of the plurality of electrodes for the period for plasma processing the substrate.

12. The substrate processing apparatus of claim 1, wherein the plurality of electrodes include an inner electrode disposed at an inner peripheral side of the one-piece focus ring part and an outer electrode disposed at an outer peripheral side of the one-piece focus ring part.

13. The substrate processing apparatus of claim 1, wherein the period other than the plasma processing period includes a cleaning period for cleaning the processing chamber, and
wherein a heat transfer medium is supplied to a space formed between the one-piece focus ring part and the focus ring mounting part and the potential difference among the plurality of electrodes are generated during the cleaning period.

14. The substrate processing apparatus of claim 1, wherein the period other than the plasma processing period includes a period in which an operation of the substrate processing apparatus is stopped, and
wherein the potential difference among the plurality of electrodes are generated during the period in which the operation of the substrate processing apparatus is stopped.

15. A substrate processing apparatus comprising:
a processing chamber;
a substrate mounting part configured to electrostatically attract a substrate;
a focus ring;
a focus ring mounting part configured to electrostatically attract the focus ring, the focus ring mounting part surrounding the substrate mounting part and including a plurality of electrodes; and
a control unit configured to control an application of voltages to the plurality of electrodes,
wherein the focus ring includes a one-piece focus ring part extending continuously from an outer periphery to an inner periphery of the of the one-piece focus ring part,
wherein the plurality of electrodes are disposed below a bottom surface of the one-piece focus ring part such that each electrode from the plurality of electrodes is partially overlapped or entirely overlapped by the bottom surface of the one-piece focus ring part from a top view perspective of the one-piece focus ring part, and
wherein the control unit is configured to control a potential difference among the plurality of electrodes to attract the one-piece focus ring part on the focus ring mounting part when no plasma is present in the processing chamber and to control application of voltages having a same polarity to each of the plurality of electrodes when the substrate is processed by a plasma in the processing chamber.

16. The substrate processing apparatus of claim 15, wherein positive voltages are applied to the plurality of electrodes when the substrate is processed by the plasma in the processing chamber.

17. The substrate processing apparatus of claim 16, wherein voltages having different polarities are applied to the plurality of electrodes to attract the one-piece focus ring part when no plasma is present in the processing chamber.

18. The substrate processing apparatus of claim 15, a period when no plasma is present in the processing chamber includes at least one of a substrate loading period during which a substrate is loaded into the processing chamber or a substrate unloading period during which a substrate is unloaded from the processing chamber.

* * * * *